US012671061B2

(12) United States Patent
Franklin et al.

(10) Patent No.: US 12,671,061 B2
(45) Date of Patent: Jun. 30, 2026

(54) TREATMENT CHAMBER WITH MODULAR MICROWAVE POWER DELIVERY

(71) Applicant: Applied Materials, Inc., Santa Clara, CA (US)

(72) Inventors: Timothy Joseph Franklin, Campbell, CA (US); Sajad Yazdani, Fremont, CA (US); Kostiantyn Achkasov, Lyons (FR); Xue Yang Chang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 82 days.

(21) Appl. No.: 18/633,158

(22) Filed: Apr. 11, 2024

(65) Prior Publication Data

US 2025/0323022 A1    Oct. 16, 2025

(51) Int. Cl.
*H01J 37/32*          (2006.01)
(52) U.S. Cl.
CPC .... *H01J 37/32247* (2013.01); *H01J 37/3222* (2013.01)
(58) Field of Classification Search
None
See application file for complete search history.

(56) References Cited

U.S. PATENT DOCUMENTS 6,603,269 B1    8/2003  Vo
10,707,058 B2 *  7/2020  Chua ................. H01J 37/32247

2005/0160987 A1 *  7/2005  Kasai ..................... H05B 6/705
                                                118/723 MW
2009/0159214 A1 *  6/2009  Kasai ................ H01J 37/32192
                                                422/186.04
2013/0284370 A1 *  10/2013  Collins ............. H01J 37/32174
                                                156/345.28
2015/0015140 A1    1/2015  Denning
2015/0170881 A1    6/2015  Komatsu
2020/0194233 A1    6/2020  Kao
2020/0381224 A1 *  12/2020  Ikeda ................ H01J 37/32275
2020/0402769 A1    12/2020  Chua
2021/0098230 A1    4/2021  Chua et al.
2021/0134560 A1 *  5/2021  Kamata ............. H01J 37/32238
2021/0391149 A1 *  12/2021  Kraus .............. H01J 37/32247
2022/0130643 A1 *  4/2022  Kaneko ............. H01J 37/32311
2022/0254641 A1 *  8/2022  Chua ..................... C23C 16/511
2023/0178339 A1 *  6/2023  Kato ................ H01J 37/32201
                                                156/345.41

OTHER PUBLICATIONS

International Search Report and Written Opinion for International Patent Application No. PCT/US2025/022730 mailed Jul. 16, 2025, 10 pgs.

* cited by examiner

*Primary Examiner* — Kenneth B Wells
(74) *Attorney, Agent, or Firm* — Schwabe, Williamson & Wyatt, P.C.

(57)          ABSTRACT

Embodiments disclosed herein include a source array. In an example, a source array includes a dielectric plate having a surface. A plurality of resonators is on the surface of the dielectric plate. The source array also includes a plurality of power amplifiers. Each one of the plurality of power amplifiers is coupled to a corresponding one of the plurality of resonators.

20 Claims, 15 Drawing Sheets

(a)                              (b)

POWER SOURCE

TREATMENT CHAMBER WITH MODULAR MICROWAVE POWER DELIVERY

BACKGROUND

1) Field

Embodiments relate to the field of semiconductor manufacturing and, in particular, to treatment chambers with modular microwave power delivery.

2) Description of Related Art

Use of high-frequency radiation systems, including for use in plasma processing, are used extensively in the manufacture of many different technologies, such as those in the semiconductor industry, display technologies, microelectromechanical systems (MEMS), and the like. Currently, radio frequency (RF) radiation systems with a single antenna are most often used. However, in the case of plasmas generated with higher frequencies, including microwave frequencies, a plasma with higher plasma density and/or a plasma with a high concentration of excited neutral species are formed. Unfortunately, high-frequency radiation systems which are generated from a single antenna, for example those used to form plasmas, suffer their own drawbacks.

Typical high-frequency radiation systems, for example those to form a microwave plasma, use a singular, large source of high-frequency or microwave radiation (e.g., a magnetron) and a transmission path for guiding the microwave radiation from the magnetron to the processing chamber. For example, in typical high power microwave applications in the semiconductor industry the transmission path is a microwave waveguide. Waveguides are used because outside of a waveguide designed to carry the specific frequency of the microwave source, the microwave power attenuates rapidly with distance. Additional components, such as tuners, couplers, mode transformers, and the like are also required to transmit the microwave radiation to the processing chamber. These components limit the construction to large systems (i.e., at least as large as the sum of the waveguide and associated components), and severely limit the design. As such, the geometry of the high-frequency radiation field, which may be used to form a plasma, is constrained since the geometry of the high-frequency radiation field resembles the shape of waveguides.

Accordingly, it is difficult to match the geometry of the high-frequency radiation field to the geometry of the substrate that is being processed. In particular, it is difficult to create a high-frequency radiation field at microwave frequencies, either to form a plasma or to expose a substrate to radiation, where the process is uniformly performed on the whole area of the substrate (e.g., 200 mm, 300 mm or larger diameter silicon wafers, glass substrates used in the display industry, or continuous substrates used in roll-to-roll manufacturing, or the like). Some microwave generated plasmas may use a slot line antenna to allow the microwave energy to be spread over an extended surface. However, such systems are complicated, require specific geometry, and are limited in the power density that can be coupled to the plasma.

Furthermore, high-frequency radiation systems typically generate radiation fields and/or plasmas that are not highly uniform and/or are not able to have a spatially tunable density. As the substrates that are being processed continue to increase in size, it becomes increasingly difficult to account for edge effects. Additionally, the inability to tune the radiation field and/or plasma limits the ability to modify processing recipes to account for incoming substrate non-uniformity and adjust the radiation field density and/or plasma density for processing systems in which a non-uniformity is required to compensate for the design of the processing system (e.g., to accommodate the non-uniform radial velocity of the rotating wafers in some processing chambers).

SUMMARY

Embodiments disclosed herein include a source array. In an embodiment, the source array includes a dielectric plate having a surface. A plurality of resonators is on the surface of the dielectric plate. The source array also includes a plurality of power amplifiers. Each one of the plurality of power amplifiers is coupled to a corresponding one of the plurality of resonators.

Additional embodiments may include a processing tool including a treatment chamber, a substrate or wafer processing region within the treatment chamber, and a source array above the substrate or wafer processing region. The source array includes a dielectric plate having a surface. A plurality of resonators is on the surface of the dielectric plate. The source array also includes a plurality of power amplifiers. Each one of the plurality of power amplifiers is coupled to a corresponding one of the plurality of resonators.

An additional embodiment disclosed herein includes a method of operating a source array. The method includes providing power to a plurality of power amplifiers, each one of the plurality of power amplifiers coupled to a corresponding one of a plurality of resonators, the plurality of resonators on the surface of a dielectric plate.

3

Figure 5:
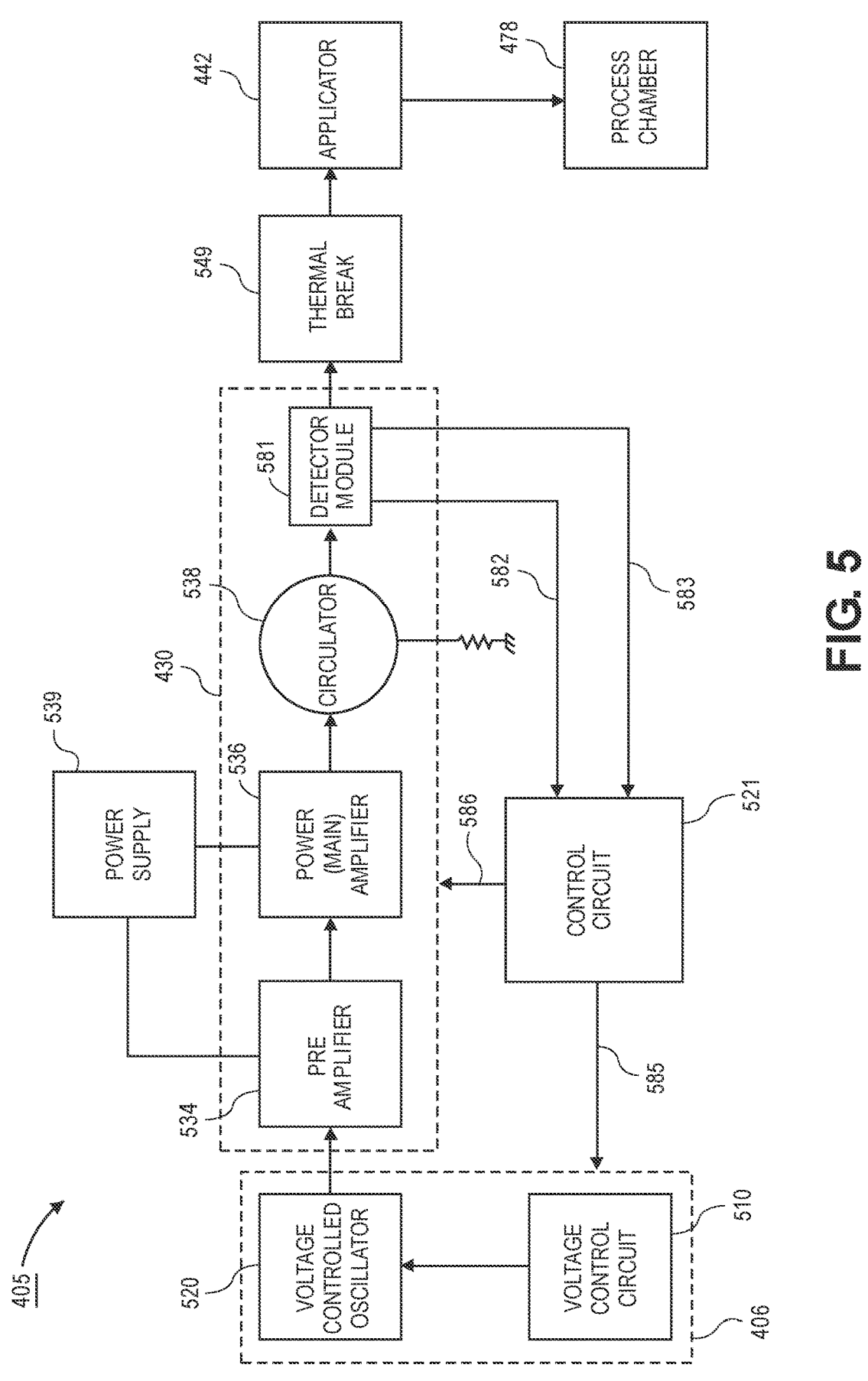

FIG. 5 is a block diagram of a modular high-frequency emission module, in accordance with an embodiment.

Figure 6A:
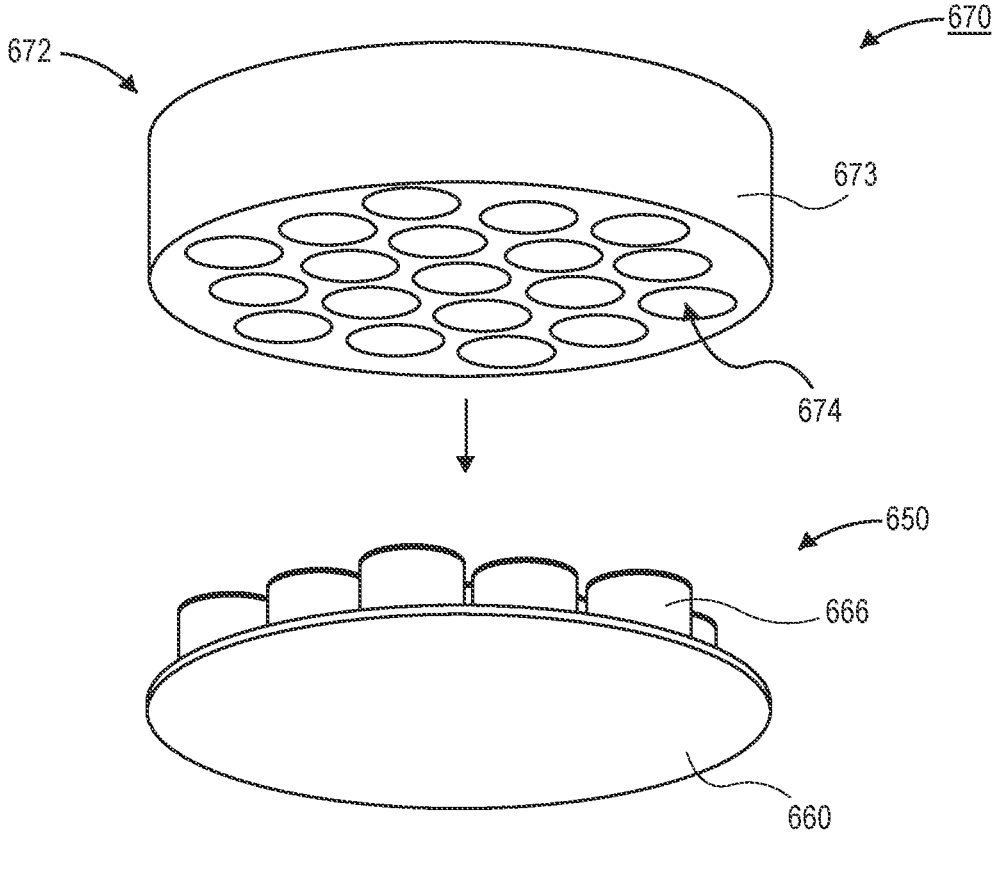

FIG. 6A is a perspective view illustration of a monolithic source array and a housing that interfaces with the monolithic source array to form an assembly, in accordance with an embodiment.

Figure 6B:
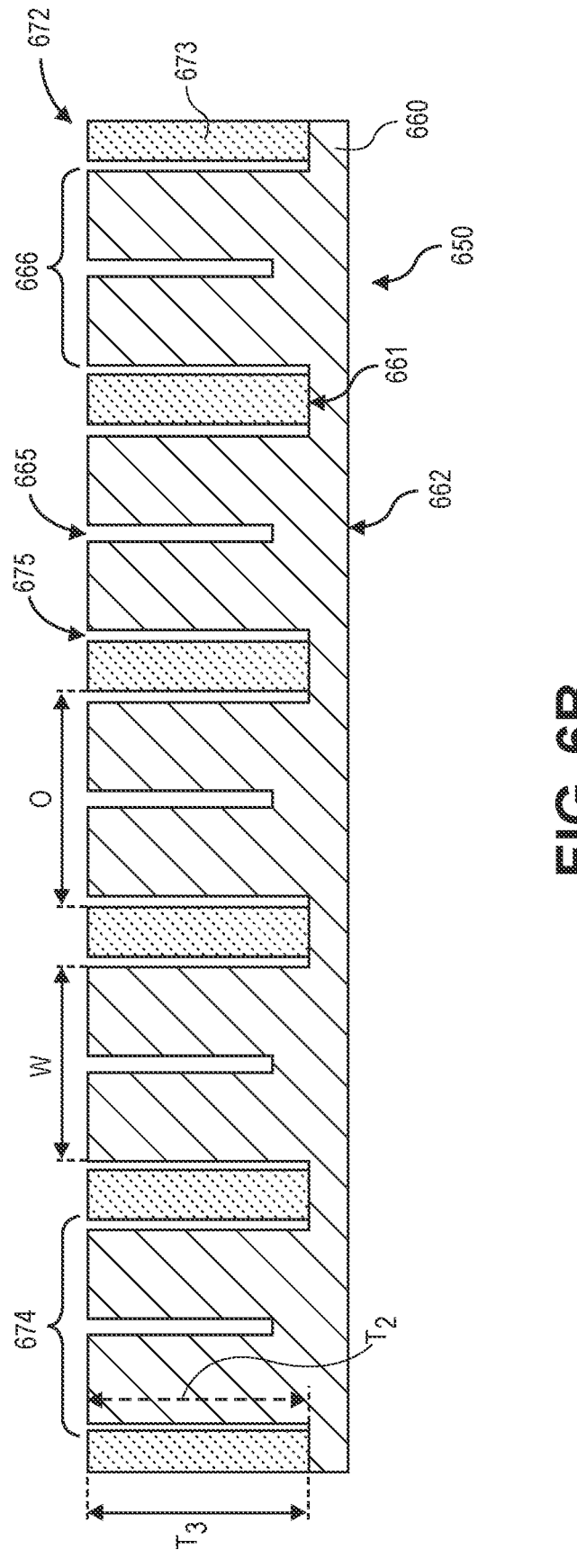

FIG. 6B is a cross-sectional illustration of assembly after the monolithic source array and the housing mated together, in accordance with an embodiment.

Figure 6C:
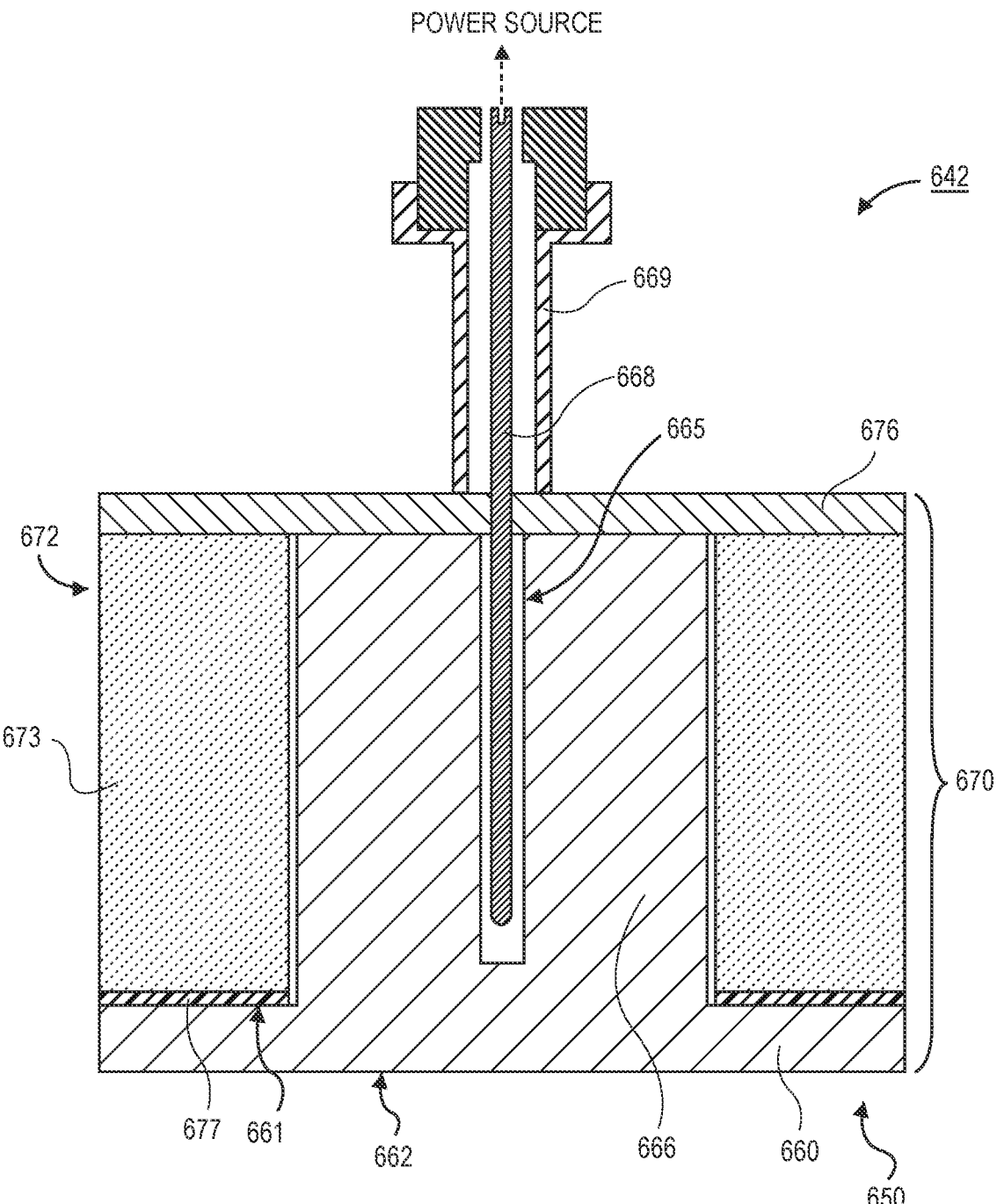

FIG. 6C is a cross-sectional illustration of an applicator that includes components from the assembly, in accordance with an embodiment.

Figure 7:
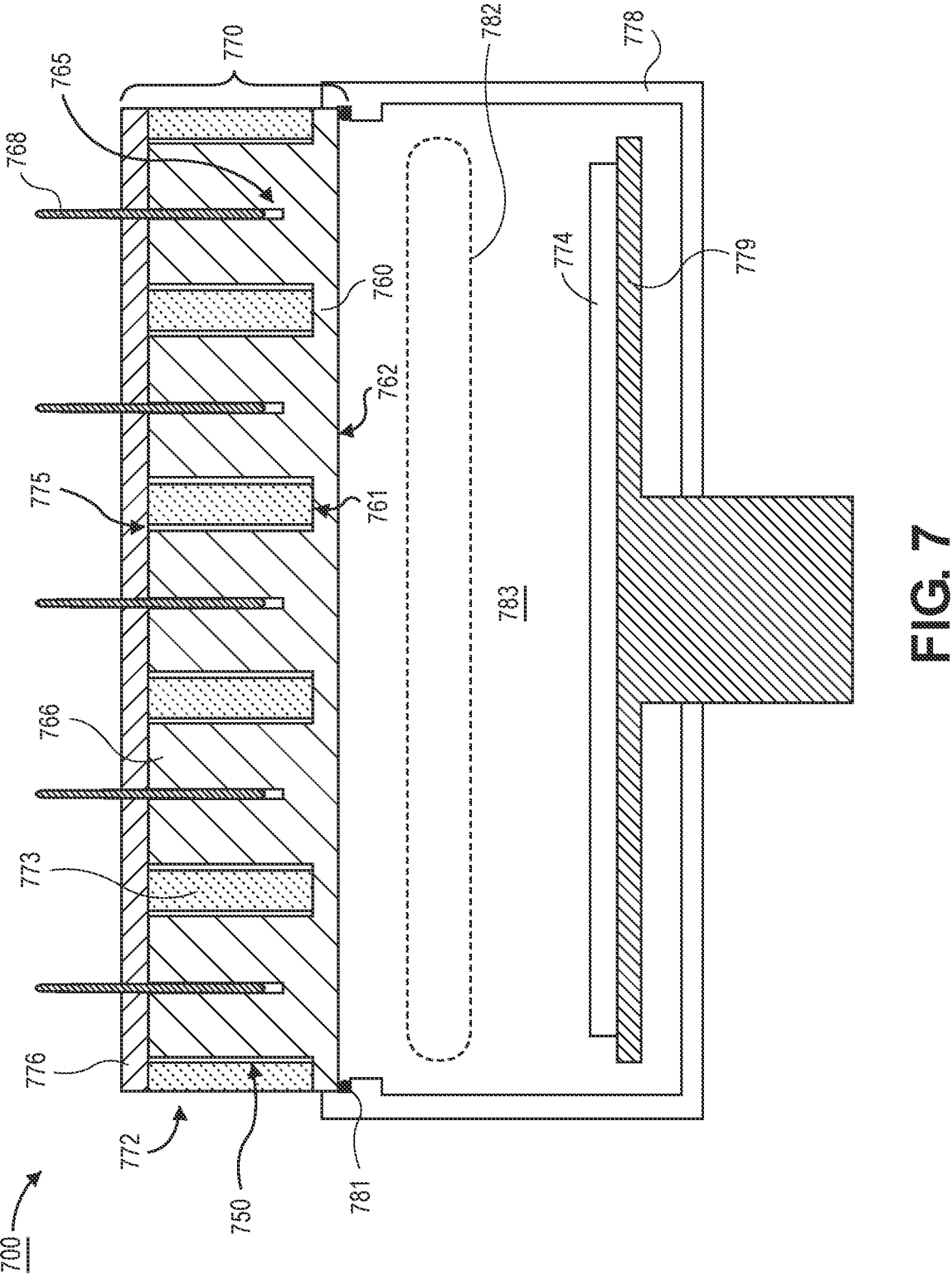

FIG. 7 is a cross-sectional illustration of a processing tool that includes an assembly that includes a monolithic source array and a housing, in accordance with an embodiment.

Figure 8:
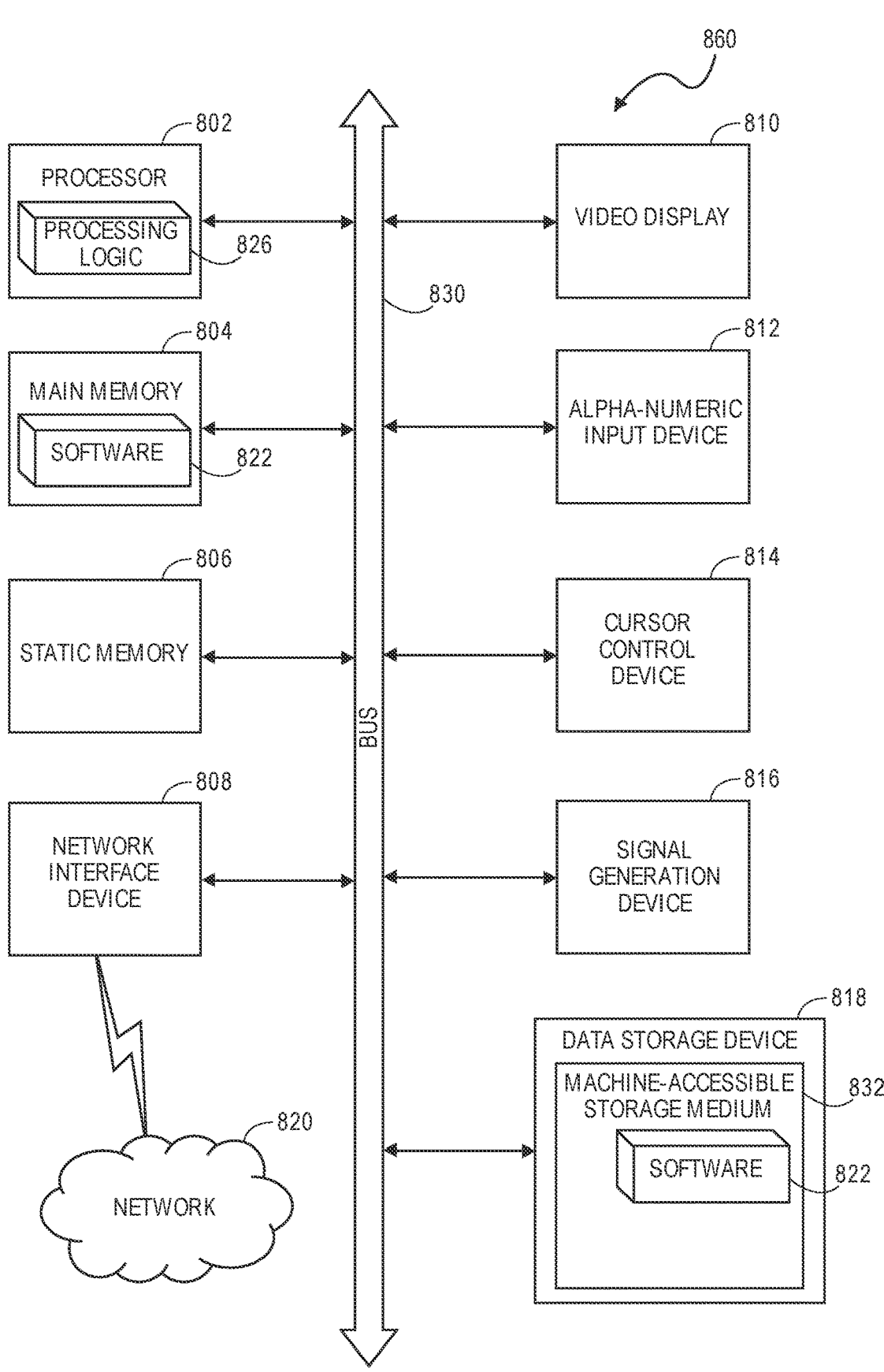

FIG. 8 illustrates a block diagram of an exemplary computer system that may be used in conjunction with a high-frequency plasma tool, in accordance with an embodiment.

DETAILED DESCRIPTION

Systems described herein include treatment chambers with modular microwave power delivery. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Various embodiments or aspects of the disclosure are described herein. In some implementations, the different embodiments are practiced separately. However, embodiments are not limited to embodiments being practiced in isolation. For example, two or more different embodiments can be combined together in order to be practiced as a single device, process, structure, or the like. The entirety of various embodiments can be combined together in some instances. In other instances, portions of a first embodiment can be combined with portions of one or more different embodiments. For example, a portion of a first embodiment can be combined with a portion of a second embodiment, or a portion of a first embodiment can be combined with a portion of a second embodiment and a portion of a third embodiment.

The embodiments illustrated and discussed in relation to the figures included herein are provided for the purpose of explaining some of the basic principles of the disclosure. However, the scope of this disclosure covers all related, potential, and/or possible, embodiments, even those differing from the idealized and/or illustrative examples presented. This disclosure covers even those embodiments which incorporate and/or utilize modern, future, and/or as of the time of this writing unknown, components, devices, systems, etc., as replacements for the functionally equivalent, analogous, and/or similar, components, devices, systems, etc., used in the embodiments illustrated and/or discussed herein for the purpose of explanation, illustration, and example.

In state-of-the-art plasma processing tools, a power delivery channel is provided in order to deliver power (e.g., radio frequency (RF) power or microwave power) to the chamber. The power delivery channel may include a power supply that is coupled to a power amplifier, a coaxial cable, an impedance match, and an antenna.

Microwave plasma sources have seen a growth in importance in semiconductor processing environments. This can be due, at least in part, to the improved plasma performance that is provided when a microwave power source is used. Compared to traditional RF based plasmas (e.g., a capacitively coupled plasma (CCP), inductively coupled plasma (ICP), etc.), the flux of radicals provided to the substrate is higher for the microwave plasma. That is, a plasma density of the microwave plasma may be higher. At the same time, the ion energy at the substrate surface for a microwave plasma is lower than the ion energy at the substrate surface for a typical RF based plasma. More particularly, the ion energy is typically well below a general damage threshold of approximately 30 eV.

Previous attempts to provide microwave power sources relied on magnetron solutions. The use of magnetrons results in bulky and hard to control systems. Magnetron solutions for implementing impedance matching are particularly problematic when a multi-channel microwave plasma tool is desired. A standard impedance matching solution for magnetron based architectures use a fixed frequency with a stub tuner (e.g., including a single stub or multiple stubs). Stub tuners are mechanically displaceable stubs that short-circuit a section of transmission line along the main signal line. By changing the positioning and/or geometry of the stubs, a variable impedance can be provided. Accordingly, the stubs and the associated actuators occupy a relatively large space. When a single microwave power delivery channel is used, this extra space is not particularly problematic. However, when multi-channel solutions are used, each channel needs a dedicated stub (or group of stubs) and the associated actuators. This can greatly increase the overall size of the tool, while also adding to the complexity of stub control. As such, it quickly becomes impractical to use multiple stub tuner solutions.

Accordingly, solid state solutions have been suggested for microwave power supplies. Solid state solutions provide enhanced control, while also shrinking the form factor of the power delivery system. One benefit of a reduced form factor is that a plurality of microwave channels can be used for a single processing tool. Instead of a fixed frequency, the solid state power amplifiers allow for variable frequency operation.

Accordingly, embodiments disclosed herein include microwave plasma tools that includes a multi-channel microwave power delivery system, where each of the power amplifiers is coupled to a corresponding resonator.

Figure 1:
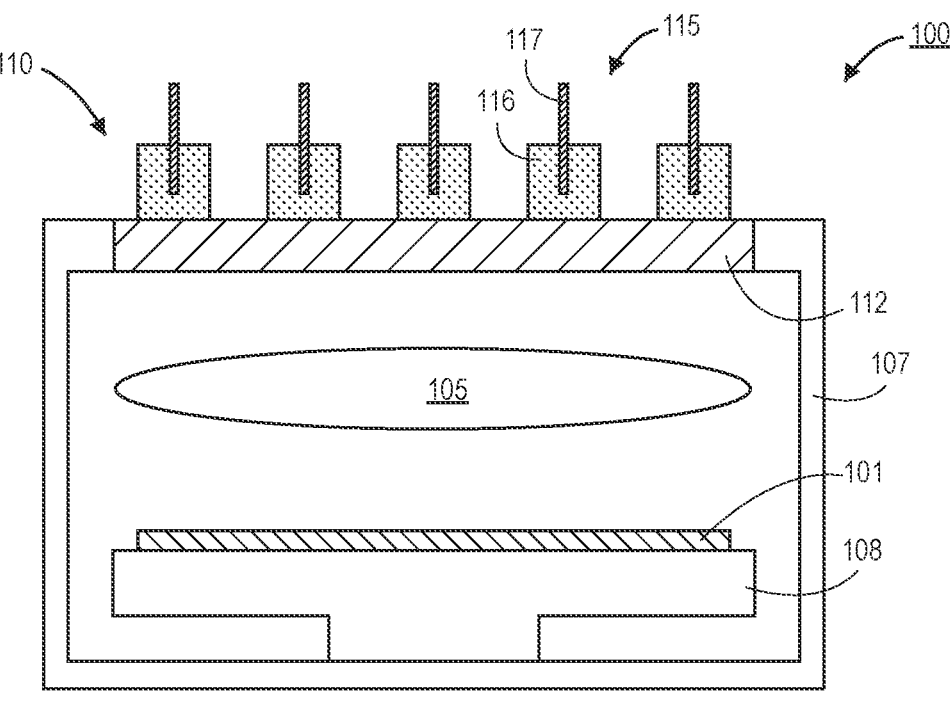
FIG. 1 is a cross-sectional illustration of a semiconductor processing tool for generating a microwave plasma using a plurality of dielectric resonator antennas (DRAs), in accordance with an embodiment.

An example of a multi-channel microwave plasma tool is shown in FIG. 1. Referring now to FIG. 1, a cross-sectional illustration of a semiconductor processing tool 100 is shown, in accordance with an embodiment. The semiconductor processing tool 100 may be a tool that processes a substrate 101 with plasma 105 that is generated through the use of microwave power. In an embodiment, the tool 100 may be a plasma deposition tool (e.g., a microwave PECVD, a microwave PEALD, etc.), a microwave plasma etching tool, a microwave plasma treatment tool, and/or the like. The substrate 101 may be any substrate suitable for fabricating semiconductor structures. For example, the substrate 101 may be a silicon wafer or any other semiconductor wafer. The substrate 101 may include any suitable form factor, such as a 300 mm diameter, a 400 mm diameter, or the like. In an embodiment, the substrate 101 may be supported on a pedestal 108. The pedestal may include a chucking device for securing the substrate 101 during processing. The chucking device may include an electrostatic chuck (ESC) or the like.

In an embodiment, the tool 100 may include a chamber 107. The chamber 107 may be suitable for supporting a vacuum environment within the chamber 107. The vacuum environment may be at a pressure suitable for the formation of the plasma 105. That is, a "vacuum environment" does not necessarily mean that a perfect vacuum environment is necessary. For example, the chamber 107 may support a rough vacuum (e.g., a pressure up to approximately 800 Torr). Though, higher vacuum environments (i.e., lower pressures) may also be supported by the chamber 107. The low pressure environment may be provided through the use of an exhaust, a vacuum pump, and/or the like (not shown for simplicity). The chamber 107 may also include a slit valve (not shown) for passing the substrate 101 into and out of the chamber 107.

In an embodiment, the tool 100 may include a lid assembly 110. The lid assembly 110 may include a dielectric plate 112 that is provided opposite of the pedestal 108. The dielectric material of the dielectric plate 112 may include a ceramic in some embodiments. The dielectric plate 112 may include pathways, channels, holes, and/or the like (not shown) for distributing gasses into the chamber 107. In some instances, the dielectric plate 112 may be referred to as a showerhead. In an embodiment, a plurality of dielectric resonator antennas (DRAs) 115 may be distributed across the top surface of the dielectric plate 112. The DRAs 115 may each include a puck 116 and a pin 117 that is inserted into a hole into the top surface of the puck 116.

In an embodiment, the puck 116 is a dielectric material, such as a ceramic material or the like. The puck 116 may be the same dielectric material as the dielectric plate 112. Though, in other embodiments, the puck 116 and the dielectric plate 112 may be different materials. In an embodiment, the puck 116 is a cylindrical shaped object. Though, other axially symmetric shapes may also be used in some embodiments. The dimensions and material of the puck 116 may be chosen in order to set a desired resonant frequency for coupling microwave power into the plasma 105.

In an embodiment, the pin 117 is an electrically conductive pin (e.g., copper). The pin 117 may be inserted into the hole of the puck 116 to a desired depth. The depth into the puck 116 can be controlled in order to provide a desired response. In an embodiment, the opposite end of the pin 117 is coupled to a remainder of the microwave power supply system (which will be described in greater detail below). For example, the pin 117 may be coupled to an impedance match.

In the illustrated embodiment, the DRA 115 is shown as a bare dielectric material puck 116 with an electrically conductive pin 117. However, it is to be appreciated that the DRA 115 may include a housing that surrounds portions (or all of) the DRA 115. For example, an electrically conductive housing may be provided around the DRA 115. The electrically conductive housing may be grounded in some embodiments. In an embodiment, the housing may include aluminum or the like.

Figure 2:
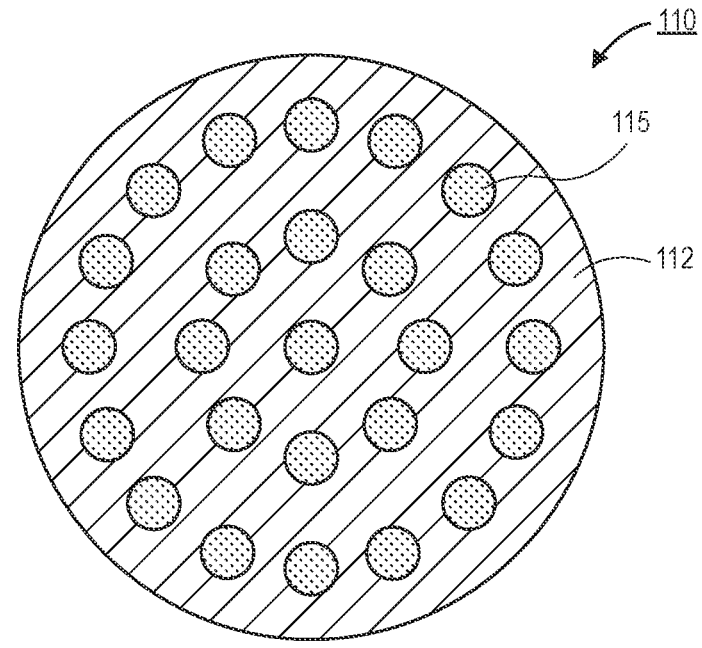
FIG. 2 is a plan view illustration of a DRA array over a dielectric plate for use in a microwave plasma semiconductor processing tool, in accordance with an embodiment.

Referring now to FIG. 2, a plan view illustration of a lid assembly 110 is shown, in accordance with an embodiment. In an embodiment, the lid assembly 110 may be similar to the lid assembly 110 described above with respect to FIG. 1. For example, the lid assembly 110 may include a dielectric plate 112. The dielectric plate 112 in FIG. 2 is shown as being circular. Though, in other embodiments, the dielectric plate 112 may have any shape. The dielectric plate 112 may include a ceramic material in some embodiments.

In an embodiment, a plurality of DRAs 115 may be distributed across the dielectric plate 112. The DRAs 115 may be similar to the DRAs 115 described above with respect to FIG. 1. For example, each DRA 115 may include a puck and a pin. A housing may also surround the puck and pin of each DRA 115. In the illustrated embodiment, twenty five DRAs 115 are distributed across the dielectric plate 112. Though, it is to be appreciated that one or more DRAs 115 may be included in the lid assembly 110 in other embodiments. In a particular embodiment, nine, ten or eleven DRAs 115 are provided on the dielectric plate 112.

In an embodiment, the layout of the plurality of DRAs 115 may include any suitable pattern. In a particular embodiment, the DRAs 115 may be provided in a symmetric pattern about the dielectric plate 112. Embodiments may also include a series of DRA 115 rings that are substantially concentric with each other, as shown in FIG. 2. Other packing configurations may also be used in order to provide denser DRA 115 layouts.

The use of a plurality of DRAs 115 allows for greater control of the processing environment within the chamber 107. That is, the plasma 105 can be controlled with greater spatial variation. This allows for different plasma parameters to be applied to (for example) the center of the substrate 101 and the edge of the substrate 101. Variable control in this manner can lead to improved overall processing uniformity.

In accordance with one or more embodiments of the present disclosure, the number of microwave power delivery channels is equal to the number of DRAs that are desired for the tool. In an embodiment, a microwave power delivery channel may include a microwave power amplifier, such as a solid state microwave power amplifier. In an embodiment, a treatment chamber architecture with modular microwave power delivery modules is described.

Implementation of embodiments described herein can include use of a scalable modular power amplifier. Implementation of embodiments described herein can provide serviceability downtime reduction of greater than 50%. Implementation of embodiments described herein can provide microwave cost reduction through shared components. Implementation of embodiments described herein can include non-uniformity control with a multi-channel architecture.

To provide context, a localized microwave power amplifier with on-board ECAT controls can be implemented to maintain lower power delivery losses. Remote non-critical components can be used (e.g., power supplies, ECAT hub, interlock controller). Minimal chamber down-time can be achieved due to no component removal requirements to open/service the chamber. A compact architecture can be achieved and module reuse realized for cost savings. Reliability improvement can be achieved by elimination of all microwave coaxial cables.

Embodiments can include localized power amplifiers with slip fit type-N connectors (e.g., no coaxial cables required). This can reduce power losses. Embodiments can include remoting of all non-critical modules to save space, cutting green-to-green time by greater than 50% and reducing module cost through sharing. Embodiments can include a scalable power delivery architecture for non-uniformity control and process improvements. Power densities of in a range of 100 W to 550 W, e.g., 300 Watts, per channel/power amplifier can be achieved.

Figure 3A:
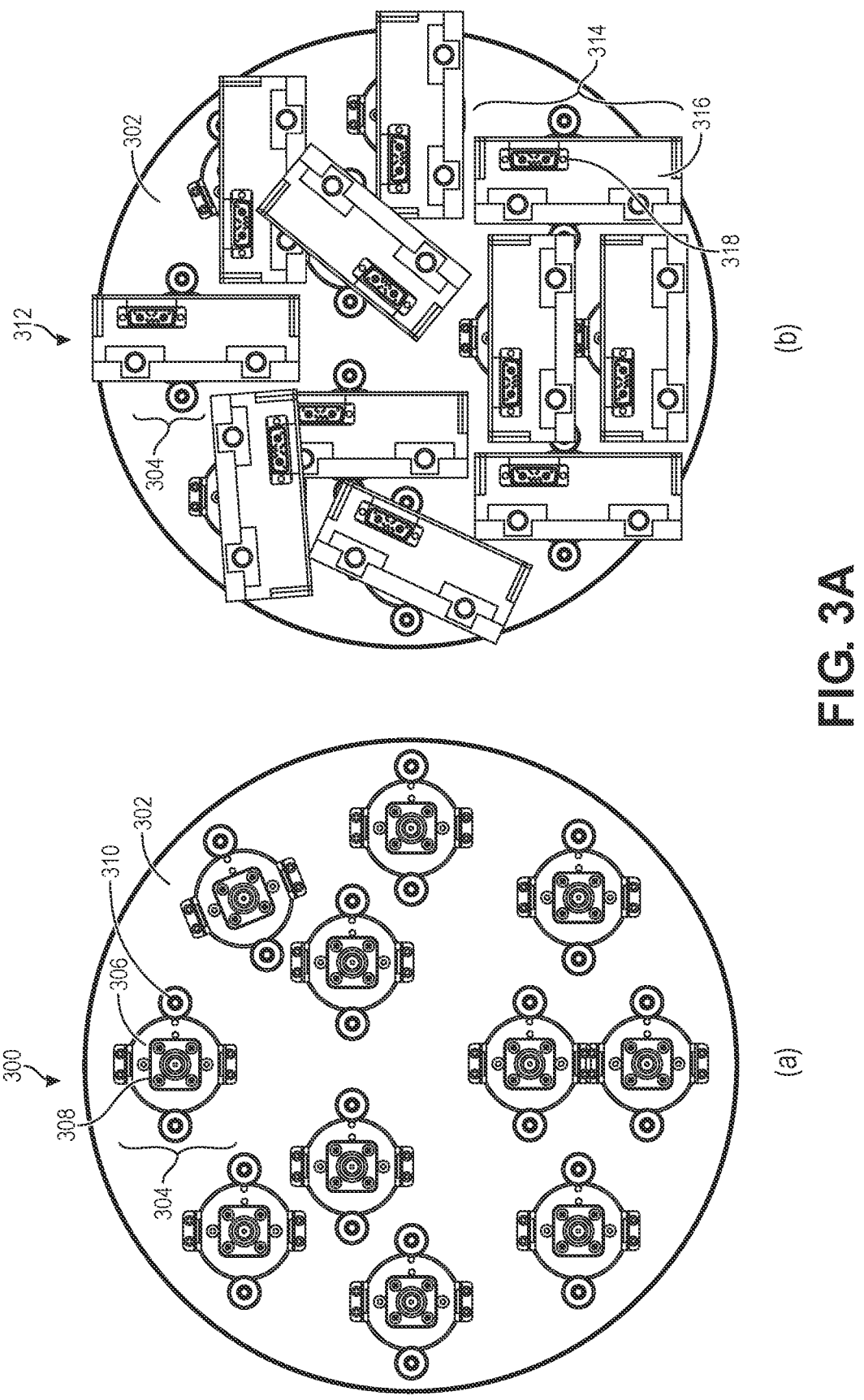
FIG. 3A illustrates plan views of a source array, in accordance with an embodiment of the present disclosure.

FIG. 3A illustrates plan views of a source array, in accordance with an embodiment of the present disclosure.

Referring to part (a) of FIG. 3A, a source array 300 includes a dielectric plate 302. Resonators 304 are on a top surface of the dielectric plate 302. Each resonator 304 can include or be associated with a resonator body 306, a clamp or bracket 308, and cooling channels 310. Referring to part (b) of FIG. 3A, an individual or dedicated (1:1 corresponding) channel or power amplifier 314 is coupled to each of the resonators 304 (e.g., by clamp or bracket 308) to provide source array 312. Each channel or power amplifier 314 can include a body 316 and electrical and/or communication connections 318. The source array 312 can be referred to as an 11-resonator array, with eight outer resonators and three inner resonators.

Figure 3B:
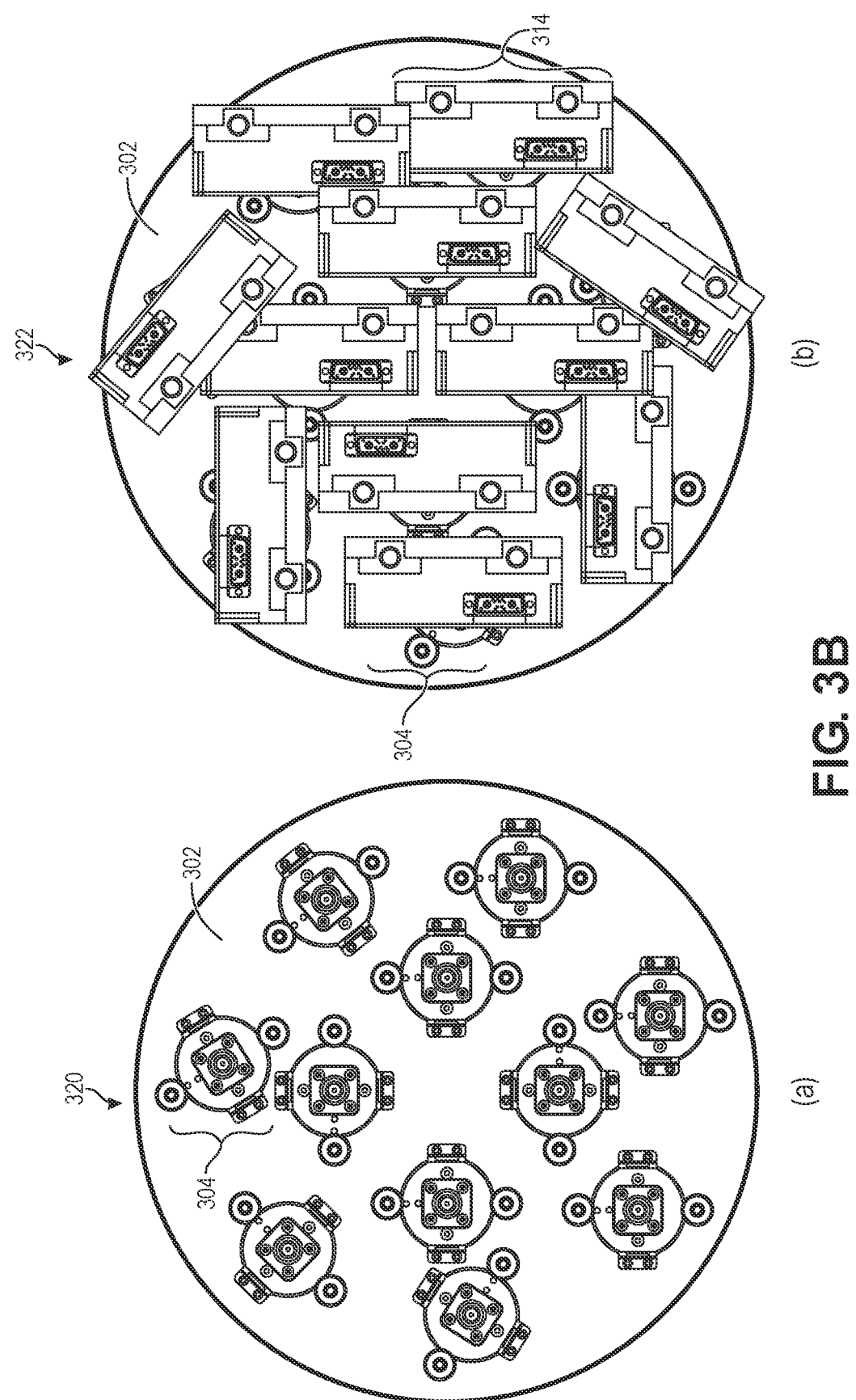
FIG. 3B illustrates plan views of another source array, in accordance with another embodiment of the present disclosure.

FIG. 3B illustrates plan views of another source array, in accordance with another embodiment of the present disclosure.

Referring to part (a) of FIG. 3B, a source array 320 includes a dielectric plate 302. Resonators 304 are on a top surface of the dielectric plate 302. Referring to part (b) of FIG. 3B, an individual or dedicated (1:1 corresponding) channel or power amplifier 314 is coupled to each of the resonators 304 (e.g., by a clamp or bracket) to provide source array 322. The source array 322 can be referred to as an 11-resonator array, with seven outer resonators and four inner resonators.

Figure 3C:
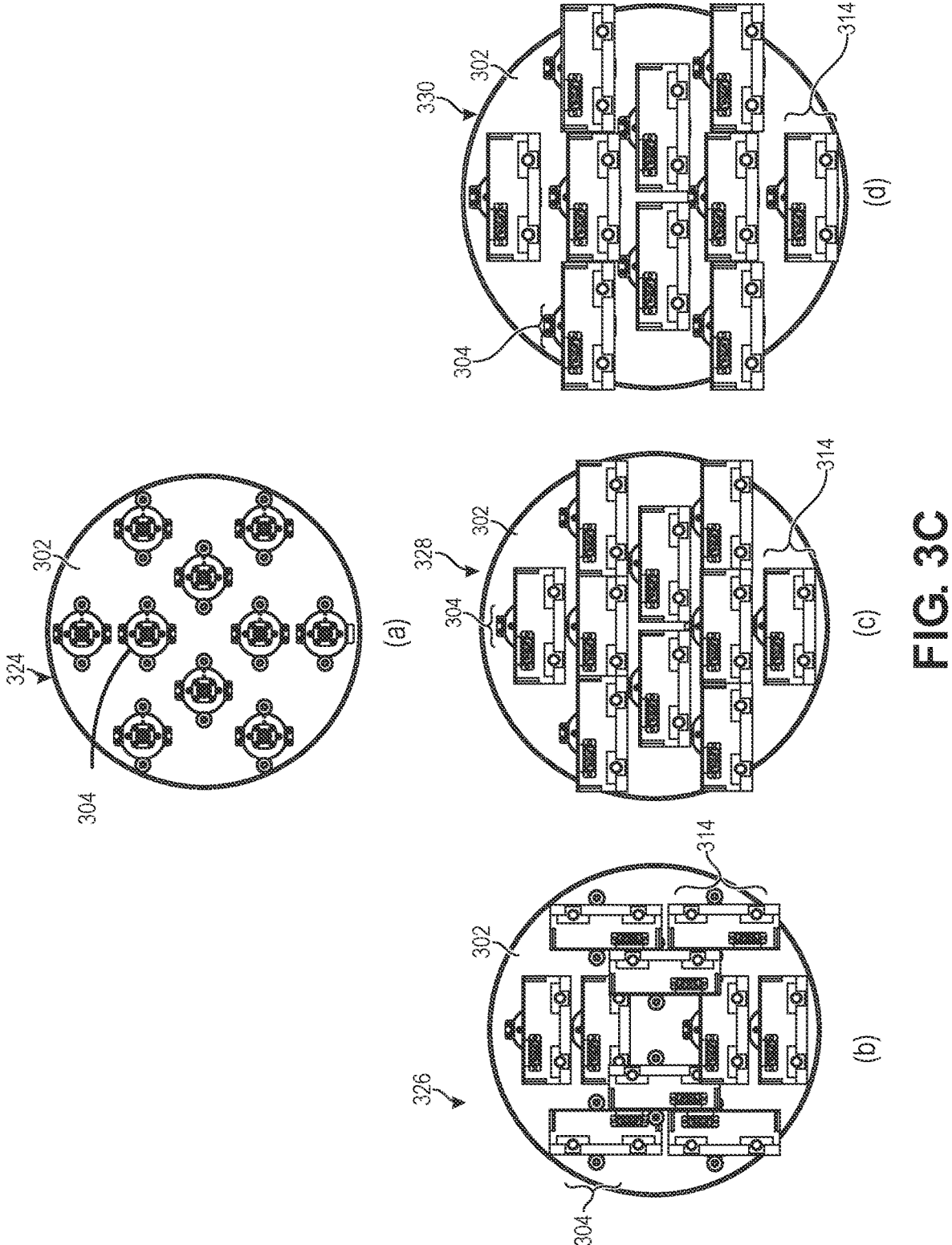
FIG. 3C illustrates plan views of other source arrays, in accordance with another embodiment of the present disclosure.

FIG. 3C illustrates plan views of other source arrays, in accordance with another embodiment of the present disclosure.

Referring to part (a) of FIG. 3C, a source array 324 includes a dielectric plate 302. Resonators 304 are on a top surface of the dielectric plate 302. Referring to parts (b), (c) and (d) of FIG. 3C, an individual or dedicated (1:1 corresponding) channel or power amplifier 314 is coupled to each of the resonators 304 (e.g., by a clamp or bracket) to provide source array 326, 328 or 330, respectively, albeit with three different possible arrangement provided for the power amplifiers 314. The source array 324 can be referred to as an 10-resonator array, with six outer resonators and four inner resonators.

Figure 3D:
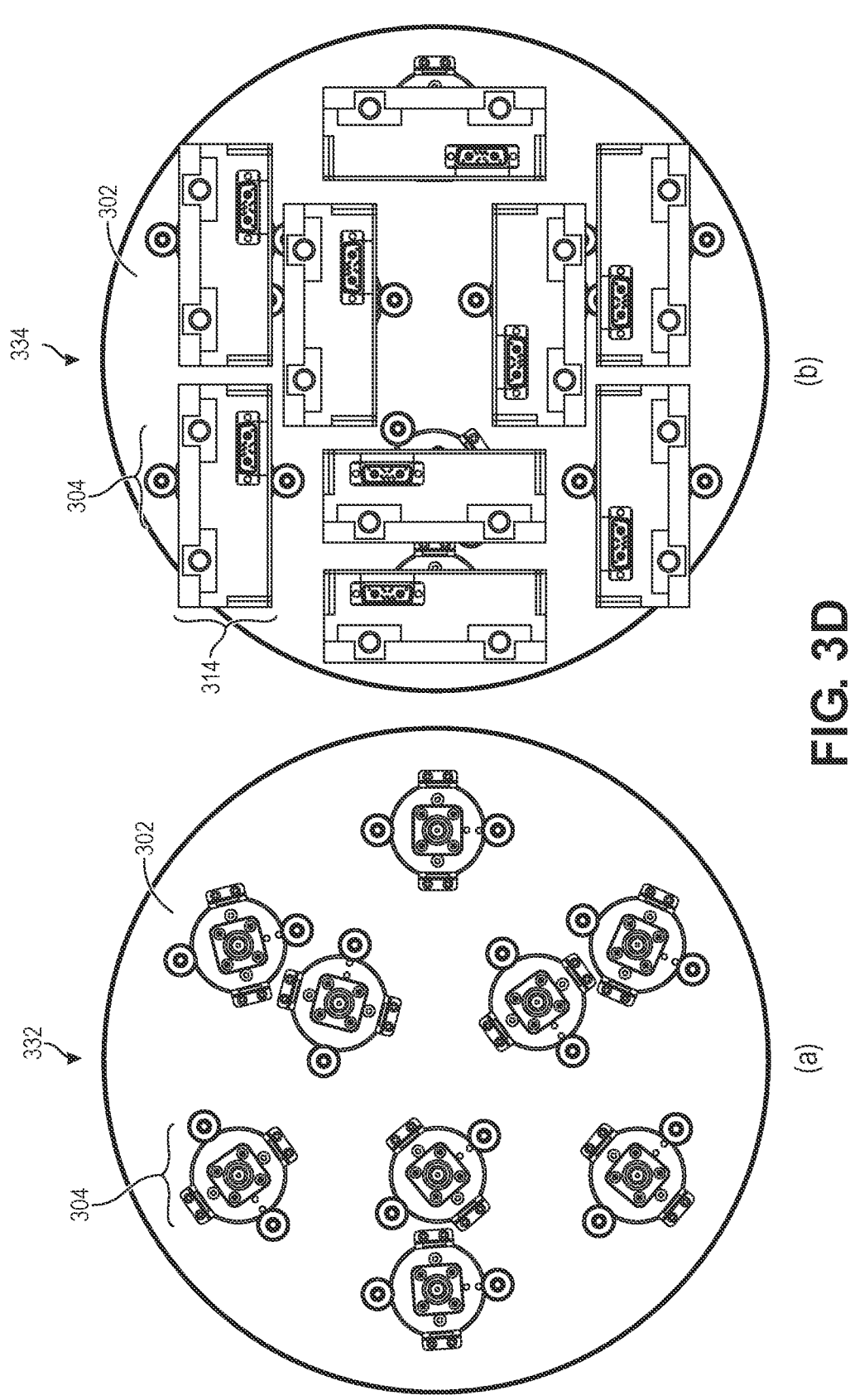
FIG. 3D illustrates plan views of another source array, in accordance with another embodiment of the present disclosure.

FIG. 3D illustrates plan views of another source array, in accordance with another embodiment of the present disclosure.

Referring to part (a) of FIG. 3D, a source array 332 includes a dielectric plate 302. Resonators 304 are on a top surface of the dielectric plate 302. Referring to part (b) of FIG. 3D, an individual or dedicated (1:1 corresponding) channel or power amplifier 314 is coupled to each of the resonators 304 (e.g., by a clamp or bracket) to provide source array 334. The source array 332 can be referred to as an 9-resonator array, with six outer resonators and three inner resonators.

Figure 3E:
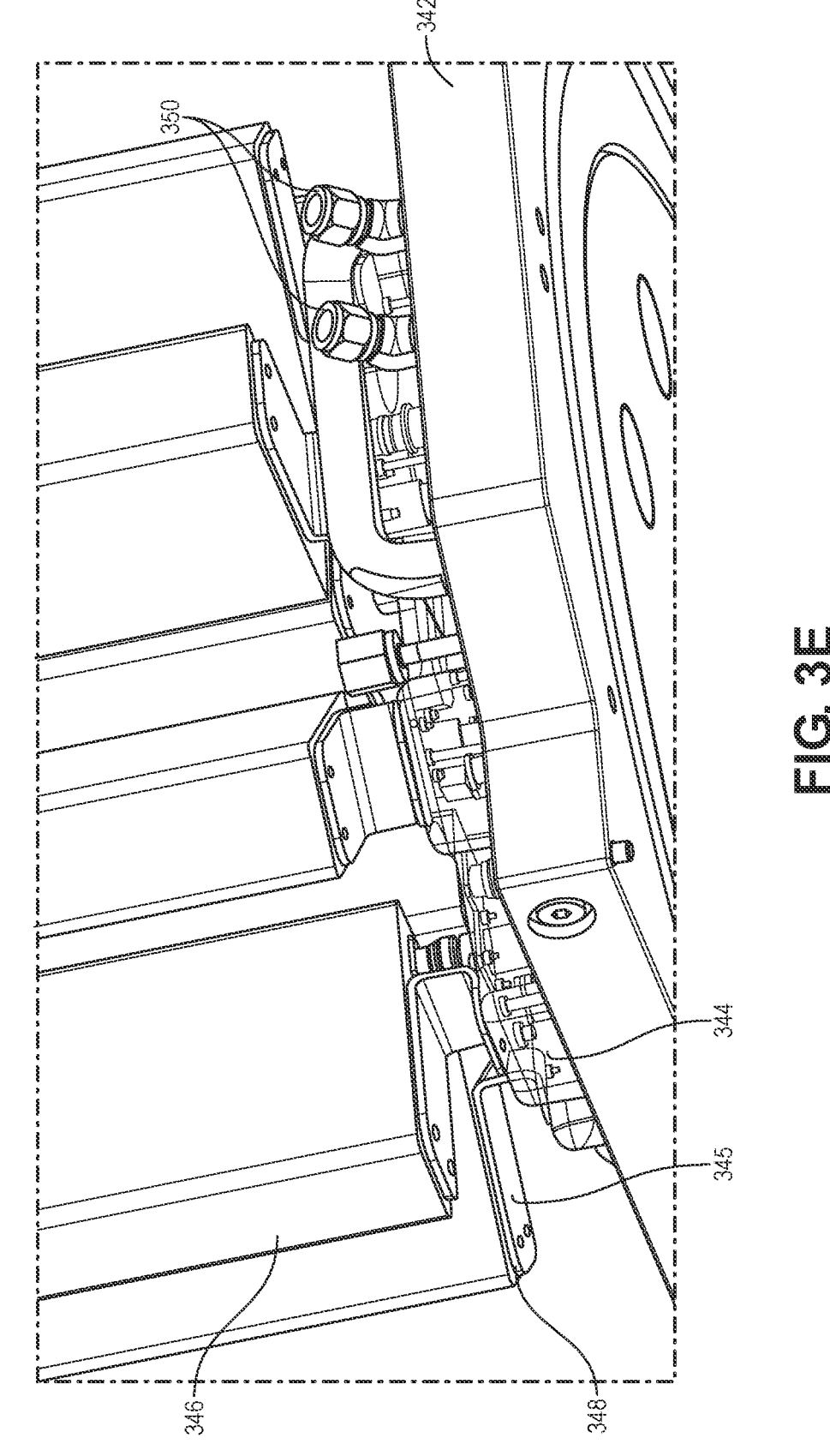
FIG. 3E illustrates an angled perspective view of a source array highlighting a power amplifier and resonator interface, in accordance with an embodiment of the present disclosure.

FIG. 3E illustrates an angled perspective view of a source array highlighting a power amplifier and resonator interface, in accordance with an embodiment of the present disclosure.

Referring to FIG. 3E, a source array 340 includes a dielectric plate 342. Resonators 344 are on a top surface of the dielectric plate 342. An individual or dedicated (1:1 corresponding) channel or power amplifier 346 is coupled to each of the resonators 344 (e.g., by a clamp or bracket 345). The source array 340 can also include inlets/outlets 350 to enable flow of cooling gases within the resonators 344 and/or the dielectric plate 342.

Figure 3F:
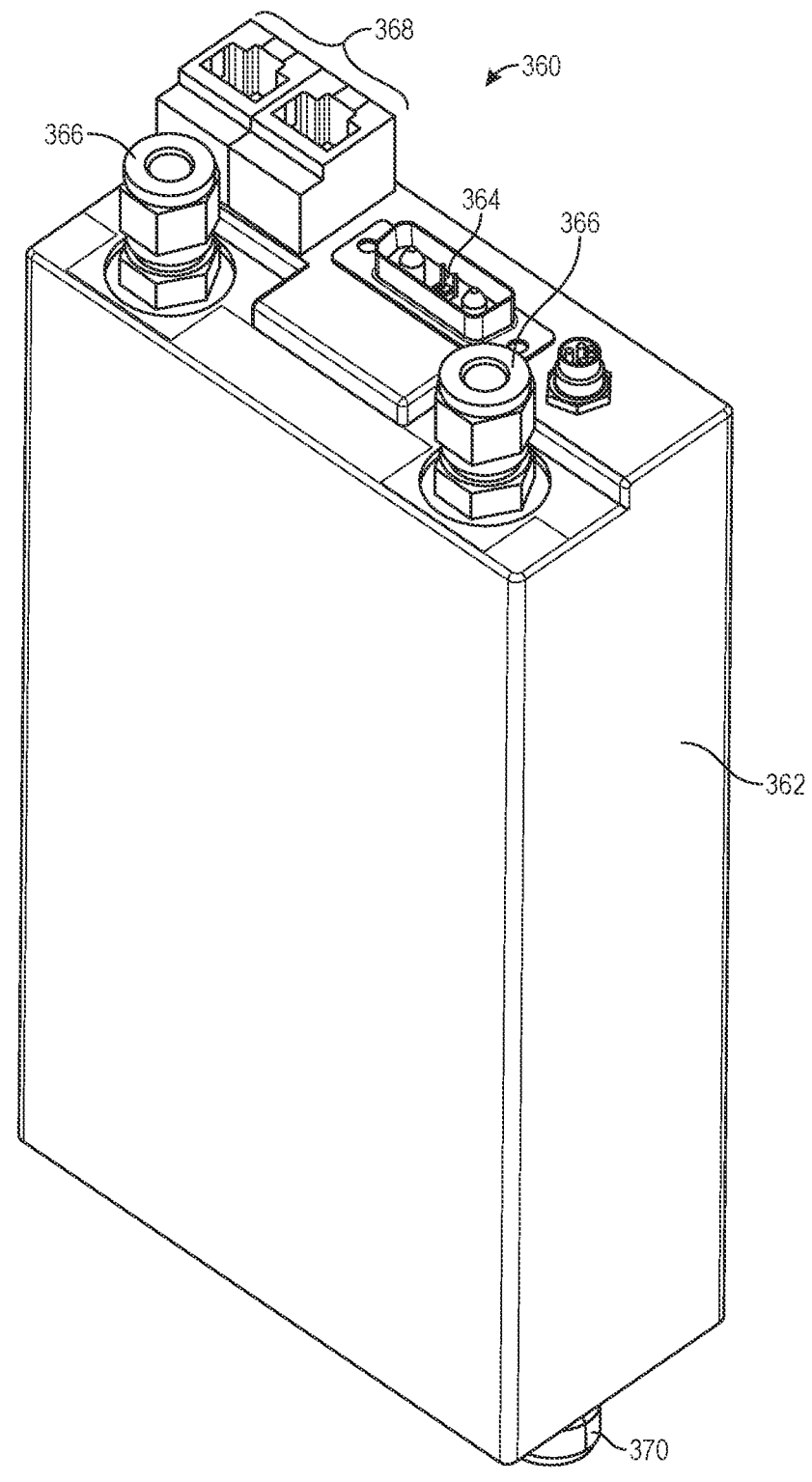
FIG. 3F illustrates a top-down angled perspective view of a power amplifier, in accordance with an embodiment of the present disclosure.
Figure 3G:
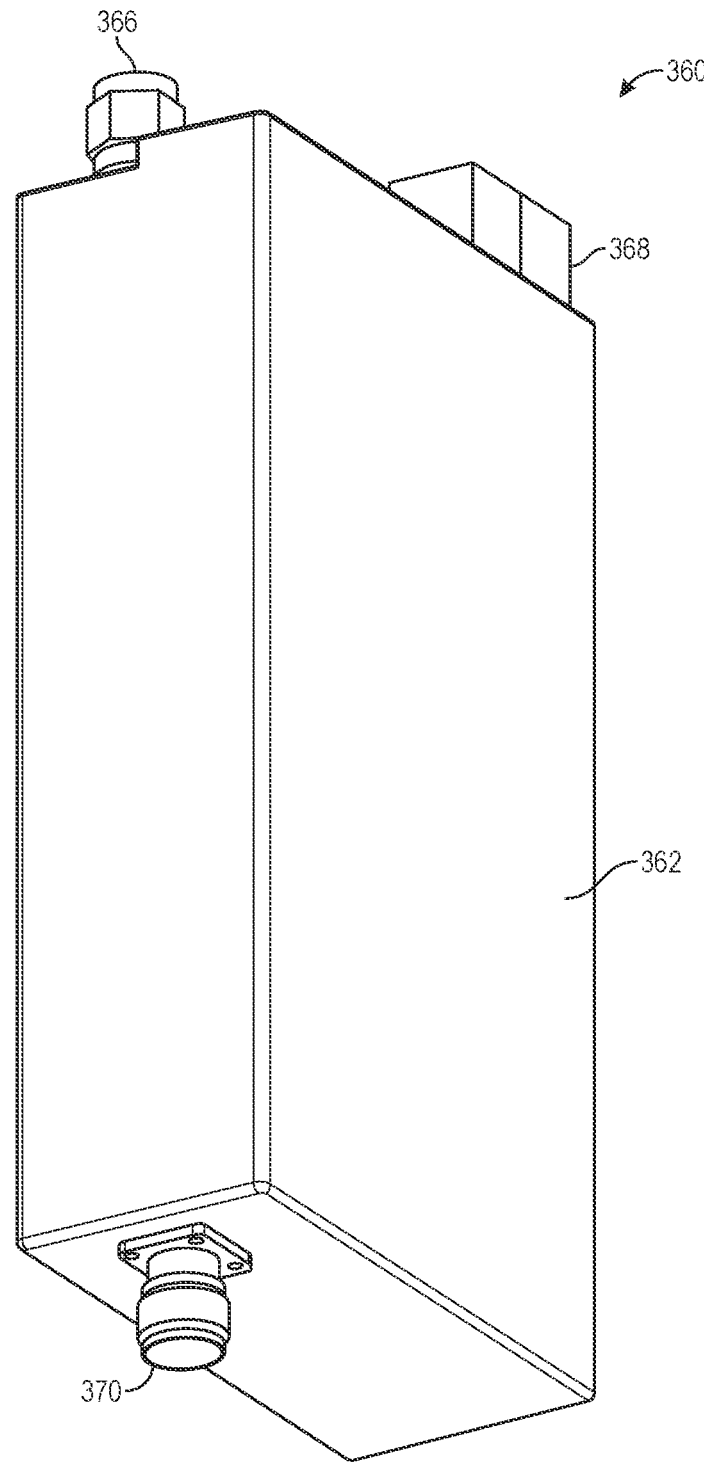
FIG. 3G illustrates a bottom-up angled perspective view of a power amplifier, in accordance with an embodiment of the present disclosure.

FIG. 3F illustrates a top-down angled perspective view of a power amplifier, and FIG. 3G illustrates a bottom-up angled perspective view of a power amplifier, in accordance with an embodiment of the present disclosure.

Referring to FIGS. 3F and 3G, a power amplifier 360 includes a channel body 362, electrical and/or communication ports 364, cooling gas inlets/outlets 366, electrical and/or communication ports 368, and cooling gas inlet/outlet 370.

In another aspect, embodiments relate to the field of semiconductor manufacturing and, in particular, to monolithic source arrays for high-frequency plasma sources. It is to be appreciated that for each of the resonators and/or antennas described below, a corresponding channel or power amplifier can be dedicated thereto, providing a 1:1 arrangement such as those described above.

Some high-frequency plasma sources include applicators that pass through an opening in a dielectric plate. The opening through the dielectric plate allows for the applicator (e.g., a dielectric cavity resonator) to be exposed to the plasma environment. However, it has been shown that plasma is also generated in the opening in the dielectric plate in the space surrounding the applicator. This has the potential of generating plasma non-uniformities within the processing chamber. Furthermore, exposing the applicator to the plasma environment may lead to a more rapid degradation of the applicator.

In some embodiments, the applicators are positioned over the dielectric plate or within a cavity into (but not through) the dielectric plate. Such configurations have reduced coupling with the interior of the chamber and, therefore, does not provide an optimum plasma generation. The coupling of the high-frequency electromagnetic radiation with the interior of the chamber is diminished in part due to the additional interface between the dielectric plate and the applicator across which the high-frequency electromagnetic radiation needs to propagate. Additionally, variations of the interface (e.g., positioning of the applicator, surface roughness of the applicator and/or the dielectric plate, angle of the applicator relative to the dielectric plate, etc.) at each applicator and across different processing tools may result in plasma non-uniformities.

Particularly, when the applicators are discrete components from the dielectric plate, plasma non-uniformity (within a single processing chamber and/or across different processing chambers (e.g., chamber matching)) is more likely to occur. For example, with discrete components, small variations (e.g., variations in assembly, machining tolerances, etc.) can result in plasma non-uniformities that negatively affect processing conditions within the chamber.

As noted above, high-frequency plasma sources with discrete applicators may result in plasma non-uniformities within a chamber and in non-optimum injection of the high-frequency electromagnetic radiation into the chamber. The non-uniformities in the plasma may arise for different reasons, such as assembly issues, manufacturing tolerances, degradation, and the like. The non-optimum injection of the high-frequency electromagnetic radiation into the chamber may result (in part) from the interface between the applicator and the dielectric plate.

Accordingly, embodiments disclosed herein include a monolithic source array. In an embodiment, the monolithic source array includes a dielectric plate and a plurality of protrusions that extend up from a surface of the dielectric plate. Particularly, the protrusions and the dielectric plate form a monolithic part. That is, the protrusions and the dielectric plate are fabricated from a single block of material. The protrusions have dimensions suitable for being used as the applicators. For example, holes into the protrusions may be fabricated that accommodate a monopole antenna. The protrusions may, therefore, function as a dielectric cavity resonator.

Implementing the source array as a monolithic part has several advantages. One benefit is that tight machining tolerances may be maintained in order to provide a high degree of uniformity between parts. Whereas discrete applicators need assembly, the monolithic source array avoids possible assembly variations. Additionally, the use of a monolithic source array provides improved injection of high-frequency electromagnetic radiation into the chamber, because there is no longer a physical interface between the applicator and the dielectric plate.

Monolithic source arrays also provide improved plasma uniformity in the chamber. Particularly, the surface of the dielectric plate that is exposed to the plasma does not include any gaps to accommodate the applicators. Furthermore, the lack of a physical interface between the protrusions and the dielectric plate improves lateral electric field spreading in the dielectric plate.

Figure 4:
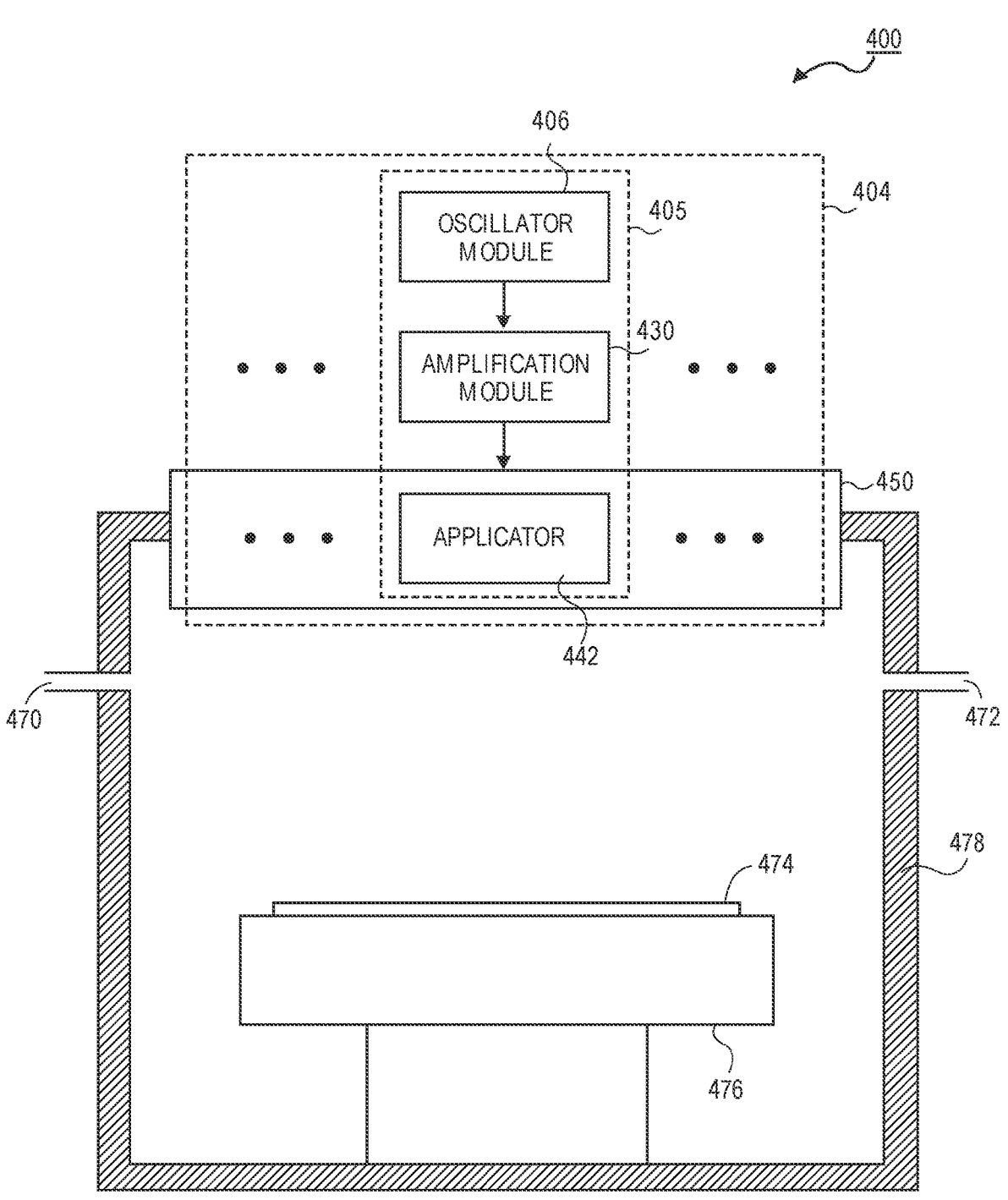
FIG. 4 is a schematic illustration of a processing tool that includes a modular high-frequency emission source with a monolithic source array that includes a plurality of applicators, in accordance with an embodiment.

Referring now to FIG. 4, a cross-sectional illustration of a plasma processing tool 400 is shown, according to an embodiment. In some embodiments, the processing tool 400 may be a processing tool suitable for any type of processing operation that utilizes a plasma. For example, the processing tool 400 may be a processing tool used for plasma enhanced chemical vapor deposition (PECVD), plasma enhanced atomic layer deposition (PEALD), etch and selective removal processes, and plasma cleaning. Additional embodiments may include a processing tool 400 that utilizes high-frequency electromagnetic radiation without the generation of a plasma (e.g., microwave heating, etc.). As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 400 that includes a chamber 478. In processing tools 400, the chamber 478 may be a vacuum chamber. A vacuum chamber may include a pump (not shown) for removing gases from the chamber to provide the desired vacuum. Additional embodiments may include a chamber 478 that includes one or more gas lines 470 for providing processing gasses into the chamber 478 and exhaust lines 472 for removing byproducts from the chamber 478. While not shown, it is to be appreciated that gas may also be injected into the chamber 478 through a monolithic source array 450 (e.g., as a showerhead) for evenly distributing the processing gases over a substrate 474.

In an embodiment, the substrate 474 may be supported on a chuck 476. For example, the chuck 476 may be any suitable chuck, such as an electrostatic chuck. The chuck 476 may also include cooling lines and/or a heater to provide temperature control to the substrate 474 during processing. Due to the modular configuration of the high-frequency emission modules described herein, embodiments allow for the processing tool 400 to accommodate any sized substrate 474. For example, the substrate 474 may be a semiconductor wafer (e.g., 200 mm, 300 mm, 450 mm, or larger). Alternative embodiments also include substrates 474 other than semiconductor wafers. For example, embodiments may include a processing tool 400 configured for processing glass substrates, (e.g., for display technologies).

According to an embodiment, the processing tool 400 includes a modular high-frequency emission source 404. The modular high-frequency emission source 404 may include an array of high-frequency emission modules 405. In an embodiment, each high-frequency emission module 405 may include an oscillator module 406, an amplification module 430, and an applicator 442. As shown, the applicators 442 are schematically shown as being integrated into the monolithic source array 450. However, it is to be appreciated that the monolithic source array 450 may be a monolithic structure that includes one or more portions of the applicator 442 (e.g., a dielectric resonating body) and a dielectric plate that faces the interior of the chamber 478.

In an embodiment, the oscillator module 406 and the amplification module 430 may include electrical components that are solid state electrical components. In an embodiment, each of the plurality of oscillator modules 406 may be communicatively coupled to different amplification modules 430. In some embodiments, there may be a 1:1 ratio between oscillator modules 406 and amplification modules 430. For example, each oscillator module 406 may be electrically coupled to a single amplification module 430. In an embodiment, the plurality of oscillator modules 406 may generate incoherent electromagnetic radiation. Accordingly, the electromagnetic radiation induced in the chamber 478 will not interact in a manner that results in an undesirable interference pattern.

In an embodiment, each oscillator module 406 generates high-frequency electromagnetic radiation that is transmitted to the amplification module 430. After processing by the amplification module 430, the electromagnetic radiation is transmitted to the applicator 442. In an embodiment, the applicators 442 each emit electromagnetic radiation into the chamber 478. In some embodiments, the applicators 442 couple the electromagnetic radiation to the processing gasses in the chamber 478 to produce a plasma.

Referring now to FIG. 5, a schematic of a solid state high-frequency emission module 405 is shown, in accordance with an embodiment. In an embodiment, the high-frequency emission module 405 includes an oscillator module 406. The oscillator module 406 may include a voltage control circuit 540 for providing an input voltage to a voltage controlled oscillator 520 in order to produce high-frequency electromagnetic radiation at a desired frequency. Embodiments may include an input voltage between approximately 1V and 10V DC. The voltage controlled oscillator 520 is an electronic oscillator whose oscillation frequency is controlled by the input voltage. According to an embodiment, the input voltage from the voltage control circuit 510 results in the voltage controlled oscillator 520 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 520 to an amplification module 430. The amplification module 430 may include a driver/pre-amplifier 534, and a main power amplifier 536 that are each coupled to a power supply 539. According to an embodiment, the amplification module 430 may operate in a pulse mode. For example, the amplification module 430 may have a duty cycle between 1% and 99%. In a more particular embodiment, the amplification module 430 may have a duty cycle between approximately 15% and 50%.

In an embodiment, the electromagnetic radiation may be transmitted to the thermal break 549 and the applicator 442 after being processed by the amplification module 430. However, part of the power transmitted to the thermal break 549 may be reflected back due to the mismatch in the output impedance. Accordingly, some embodiments include a detector module 581 that allows for the level of forward power 583 and reflected power 582 to be sensed and fed back to the control circuit module 521. It is to be appreciated that the detector module 581 may be located at one or more different locations in the system (e.g., between the circulator 538 and the thermal break 549). In an embodiment, the control circuit module 521 interprets the forward power 583 and the reflected power 582, and determines the level for the control signal 585 that is communicatively coupled to the oscillator module 406 and the level for the control signal 586 that is communicatively coupled to the amplification module 430. In an embodiment, control signal 585 adjusts the oscillator module 406 to optimize the high-frequency radiation coupled to the amplification module 430. In an embodiment, control signal 586 adjusts the amplification module 430 to optimize the output power coupled to the applicator 442 through the thermal break 549. In an embodiment, the feedback control of the oscillator module 406 and the amplification module 430, in addition to the tailoring of the impedance matching in the thermal break 549 may allow for the level of the reflected power to be less than approximately 5% of the forward power. In some embodiments, the feedback control of the oscillator module 406 and the amplification module 430 may allow for the level of the reflected power to be less than approximately 2% of the forward power.

Accordingly, embodiments allow for an increased percentage of the forward power to be coupled into the processing chamber 478, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 520.

Referring now to FIG. 6A, an exploded view of an assembly 670 is shown, in accordance with an embodiment. In an embodiment, the assembly 670 includes a monolithic source array 650 and a housing 672. The monolithic source array 650 may be substantially similar to the monolithic source arrays 350 described above. For example, the monolithic source array 650 may include a dielectric plate 660 and a plurality of protrusions 666 that extend up from the dielectric plate 660.

In an embodiment, the housing 672 includes a conductive body 673. For example, the conductive body 673 may be aluminum or the like. The housing includes a plurality of openings 674. The openings 674 may pass entirely through a thickness of the conductive body 673. The openings 674 may be sized to receive the protrusions 666. For example, as the housing 672 is displaced towards the monolithic source array 650 (as indicated by the arrow) the protrusions 666 will be inserted into the openings 674.

In the illustrated embodiment, the housing 672 is shown as a single conductive body 673. However, it is to be appreciated that the housing 672 may include one or more discrete conductive components. The discrete components may be individually grounded, or the discrete components may be joined mechanically or by any form of metallic bonding, to form a single electrically conductive body 673.

Referring now to FIG. 6B, a cross-sectional illustration of the assembly 670 is shown, in accordance with an embodiment. As shown, the conductive body 673 of the housing 672 is supported by the first surface 661 of the dielectric plate

660. In the illustrated embodiment, the conductive body 673 is directly supported by the first surface 661, but it is to be appreciated that a thermal interface material or the like may separate the conductive body 673 from the first surface 661. In an embodiment, the second surface 662 of the dielectric plate 660 faces away from the housing 672.

In an embodiment, the housing 672 has a third thickness $T_3$. The third thickness $T_3$ of the housing 672 may be similar to the second thickness $T_2$ of the protrusions 666. In other embodiments, the third thickness $T_3$ of the housing 672 may be larger or smaller than the second thickness $T_2$ of the protrusions 666.

In the illustrated embodiment, the openings 674 have an opening diameter O that is greater than the width W of the protrusions 666. The difference in the dimensions results in a gap 675 between sidewalls of the protrusions 666 and the sidewalls of the conductive body 673. The gap 675 may be suitable to allow for some degree of thermal expansion while still maintaining a secure fit between the monolithic source array 650 and the housing 672.

As will be shown in more detail below, different surfaces of the assembly 670 will be exposed to different environments. For example, the second surface 662 is configured to be exposed to a chamber volume. The opposite side of the assembly 670 is configured to be exposed to the atmosphere or other environments with pressures higher than that of the chamber volume during operation (e.g., approximately 1.0 atm or higher). Accordingly, the small gaps 675 between the conductive body 673 and the protrusions 666 will not experience a low pressure environment suitable for igniting a plasma.

Referring now to FIG. 6C, a cross-sectional illustration of an applicator 642 that is integrated with the assembly 670 is shown, in accordance with an embodiment. In an embodiment, the applicator 642 includes the protrusion 666, the conductive body 673 surrounding the protrusion 666, and the monopole antenna 668 extending into the hole 665. In an embodiment, a conductive plate 676 may also cover a top surface of the protrusion 666. Accordingly, portions of the assembly 670 may be used as components of the applicator 642. For example, the protrusion 666 is part of the monolithic source array 650 and functions as the dielectric cavity resonator of the applicator 642, and the conductive body 673 is part of the housing 672 and functions as the ground plane surrounding dielectric cavity resonator for the applicator 642.

The monopole antenna 668 may be surrounded by shielding 669 above the assembly 670, and the monopole antenna 668 may be electrically coupled to a high-frequency power source (e.g., a high-frequency emission module 405 or the like). In one embodiment, each monopole antenna 668 is coupled to its own dedicated channel or power amplifier, such as the arrangements described above in association with FIGS. 3A-3G. The monopole antenna 668 passes through conductive plate 676 and extends into the hole 665. In some embodiments, the hole 665 extends deeper into the protrusion 666 than the monopole antenna 668. Additionally, the width of the hole 665 may be greater than the width of the monopole antenna 668. Accordingly, tolerances for thermal expansion are provided in some embodiments in order to prevent damage to the monolithic source array 650. Also shown in FIG. 6C is a thermal interface material 677 between a bottom surface of the conductive body 673 and the first surface 661 of the dielectric plate 660. A thermal interface material 677 may improve heat transfer between the conductive body 673 and the dielectric plate 660 when active heating or cooling is implemented in the assembly 670. In other embodiments, the thermal interface material 677 may be a bonding layer, or a thermal interface material 677 and a bonding layer.

Referring now to FIG. 7, a cross-sectional illustration of a processing tool 700 that includes an assembly 770 is shown, in accordance with an embodiment. In an embodiment, the processing tool includes a chamber 778 that is sealed by an assembly 770. For example, the assembly 770 may rest against one or more O-rings 781 to provide a vacuum seal to an interior volume 783 of the chamber 778. In other embodiments, the assembly 770 may interface with the chamber 778. That is, the assembly 770 may be part of a lid that seals the chamber 778. In an embodiment, the processing tool 700 may include a plurality of processing volumes (which may be fluidically coupled together), with each processing volume having a different assembly 770. In an embodiment, a chuck 779 or the like may support a workpiece 774 (e.g., wafer, substrate, etc.).

In an embodiment, the assembly 770 may be substantially similar to the assemblies 470 described above. For example, the assembly 770 includes a monolithic source array 750 and a housing 772. The monolithic source array 750 may include a dielectric plate 760 and a plurality of protrusions 766 extending up from a first surface 761 of the dielectric plate 760. A second surface 762 of the dielectric plate 760 may be exposed to the interior volume 783 of the chamber 778. The housing 772 may having openings sized to receive the protrusions 766. In some embodiments gaps 775 may be provided between the protrusions 766 and the conductive body 773 of the housing 772 to allow for thermal expansion. In an embodiment, monopole antennas 768 may extend into holes 765 in the protrusions 766. The monopole antennas 768 may pass through a top plate 776 over the housing 772 and the protrusions 766.

In an embodiment, the chamber volume 783 may be suitable for striking a plasma 782. That is, the chamber volume 783 may be a vacuum chamber. In an embodiment, only the second surface 762 is exposed to the chamber volume 783 (if it is not covered by a dielectric layer, such as those described above). The opposite surfaces are outside of the chamber volume 783 and, therefore, do not experience the low pressure conditions needed to strike a plasma 782. Accordingly, even when there are high electric fields in the gaps 775 between the sidewalls of the protrusions 766 and the conductive body 773, there is no plasma generated.

Referring now to FIG. 8, a block diagram of an exemplary computer system 860 of a processing tool is illustrated in accordance with an embodiment. In an embodiment, computer system 860 is coupled to and controls processing in the processing tool. Computer system 860 may be connected (e.g., networked) to other machines in a Local Area Network (LAN), an intranet, an extranet, or the Internet. Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 832 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A source array, comprising:
a dielectric plate having a surface;
a plurality of resonators on the surface of the dielectric plate; and
a plurality of power amplifiers, each one of the plurality of power amplifiers coupled to a corresponding one of the plurality of resonators, wherein each one of the power amplifiers overlaps the corresponding one of the plurality of resonators in a plan view perspective, and wherein a first portion of the plurality of power amplifiers is oriented along a first direction, and a second portion of the plurality of power amplifiers is oriented along a second direction orthogonal to the first direction.

2. The source array of claim 1, wherein each one of the plurality of power amplifiers is coupled to the corresponding one of the plurality of resonators by a bracket or a clamp.

3. The source array of claim 1, wherein the source array does not include a coaxial cable coupled to the plurality of resonators.

4. The source array of claim 1, wherein each one of the plurality of power amplifiers provides a power level in a range of 100 W to 550 W for the source array.

5. The source array of claim 1, wherein the plurality of resonators is arranged in a concentric circle pattern on the surface of the dielectric plate.

6. The source array of claim 1, wherein the plurality of resonators is arranged in a pattern having three inner resonators and eight outer resonators on the surface of the dielectric plate.

7. The source array of claim 1, wherein the plurality of resonators is arranged in a pattern having four inner resonators and seven outer resonators on the surface of the dielectric plate.

8. The source array of claim 1, wherein the plurality of resonators is arranged in a pattern having four inner resonators and six outer resonators on the surface of the dielectric plate.

9. The source array of claim 1, wherein the plurality of resonators is arranged in a pattern having three inner resonators and six outer resonators on the surface of the dielectric plate.

10. A processing tool, comprising:
a treatment chamber;
a substrate or wafer processing region within the treatment chamber; and a source array above the substrate or wafer processing region, the source array comprising:
a dielectric plate having a surface;
a plurality of resonators on the surface of the dielectric plate; and
a plurality of power amplifiers, each one of the plurality of power amplifiers coupled to a corresponding one of the plurality of resonators, wherein each one of the power amplifiers overlaps the corresponding one of the plurality of resonators in a plan view perspective, and wherein a first portion of the plurality of power amplifiers is oriented along a first direction, and a second portion of the plurality of power amplifiers is oriented along a second direction orthogonal to the first direction.

11. The processing tool of claim 10, wherein each one of the plurality of power amplifiers of the source array is coupled to the corresponding one of the plurality of resonators by a bracket or a clamp.

12. The processing tool of claim 10, wherein the source array does not include a coaxial cable coupled to the plurality of resonators.

13. The processing tool of claim 10, wherein each one of the plurality of power amplifiers of the source array provides a power level in a range of 100 W to 550 W for the source array.

14. The processing tool of claim 10, wherein the plurality of resonators of the source array is arranged in a concentric circle pattern on the surface of the dielectric plate.

15. The processing tool of claim 10, wherein the plurality of resonators of the source array is arranged in a pattern having three inner resonators and eight outer resonators on the surface of the dielectric plate.

16. The processing tool of claim 10, wherein the plurality of resonators of the source array is arranged in a pattern having four inner resonators and seven outer resonators on the surface of the dielectric plate.

17. The processing tool of claim 10, wherein the plurality of resonators of the source array is arranged in a pattern having four inner resonators and six outer resonators on the surface of the dielectric plate.

18. The processing tool of claim 10, wherein the plurality of resonators of the source array is arranged in a pattern having three inner resonators and six outer resonators on the surface of the dielectric plate.

19. A method of operating a source array, the method comprising:
providing power to a plurality of power amplifiers, each one of the plurality of power amplifiers coupled to a corresponding one of a plurality of resonators, wherein the plurality of resonators are on the surface of a dielectric plate, wherein each one of the power amplifiers overlaps the corresponding one of the plurality of resonators in a plan view perspective, and wherein a first portion of the plurality of power amplifiers is oriented along a first direction, and a second portion of the plurality of power amplifiers is oriented along a second direction orthogonal to the first direction.

20. The method of claim 19, wherein each one of the plurality of power amplifiers provides a power level in a range of 100 W to 550 W for the source array.

* * * * *